US010468198B2

(12) United States Patent
Schumann et al.

(10) Patent No.: US 10,468,198 B2
(45) Date of Patent: Nov. 5, 2019

(54) PEDOT IN PEROVSKITE SOLAR CELLS

(71) Applicant: Heraeus Deutschland GmbH & Co. KG, Hanau (DE)

(72) Inventors: Stefan Schumann, Köln (DE); Andreas Elschner, Mülheim (DE); Armin Sautter, Dusseldorf (DE); Wilfried Lovenich, Bergisch-Gladbach (DE); Rüdiger Sauer, Leverkusen (DE); Jan Sütterlin, Köln (DE); Nina Kausch-Busies, Bergisch Gladbach (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 40 days.

(21) Appl. No.: 15/525,227

(22) PCT Filed: Nov. 17, 2015

(86) PCT No.: PCT/EP2015/076870
§ 371 (c)(1),
(2) Date: May 8, 2017

(87) PCT Pub. No.: WO2016/079145
PCT Pub. Date: May 26, 2016

(65) Prior Publication Data
US 2017/0365418 A1     Dec. 21, 2017

(30) Foreign Application Priority Data

Nov. 21, 2014  (EP) .................................. 14194360

(51) Int. Cl.
*H01G 9/20*       (2006.01)
*C08G 61/12*      (2006.01)
(Continued)

(52) U.S. Cl.
CPC ......... *H01G 9/2059* (2013.01); *C08G 61/126* (2013.01); *H01G 9/0029* (2013.01);
(Continued)

(58) Field of Classification Search
CPC ............. H01L 51/0032; H01L 51/0077; H01L 51/4226; H01L 51/0037; H01L 51/424;
(Continued)

(56) References Cited

U.S. PATENT DOCUMENTS

| 5,225,320 A * | 7/1993 | Kuse .................... G03C 7/3046 |
| | | 430/372 |
| 2010/0043411 A1* | 2/2010 | Morton ................. C08F 255/00 |
| | | 60/295 |
| 2011/0019339 A1* | 1/2011 | Merker .................. H01G 9/025 |
| | | 361/523 |

FOREIGN PATENT DOCUMENTS

| EP | 2747101 A1 | 6/2014 |
| WO | WO-2014045021 A1 | 3/2014 |

(Continued)

OTHER PUBLICATIONS

Andreas Elschner, et al., ITO Alternative: Solution Deposited Clevios™ PEDOT:PSS for Transparent Conductive Applications, 2012, 1-11.

*Primary Examiner* — Thanh Y. Tran
(74) *Attorney, Agent, or Firm* — Blank Rome LLP

(57) ABSTRACT

The present invention relates to a process for the production of a layered body (1), at least comprising the process steps: I) provision of a photoactive layer comprising a material having a perovskite type crystal structure; II) superimposing the photoactive layer at least partially with a coating composition A) comprising an electrically conductive polymer a) and an organic solvent b); III) at least partial removal of the organic solvent b) from the coating composition A) superimposed in process step II), thereby obtaining an electrically conductive layer superimposed on the photoactive layer. The
(Continued)

Figure 1:
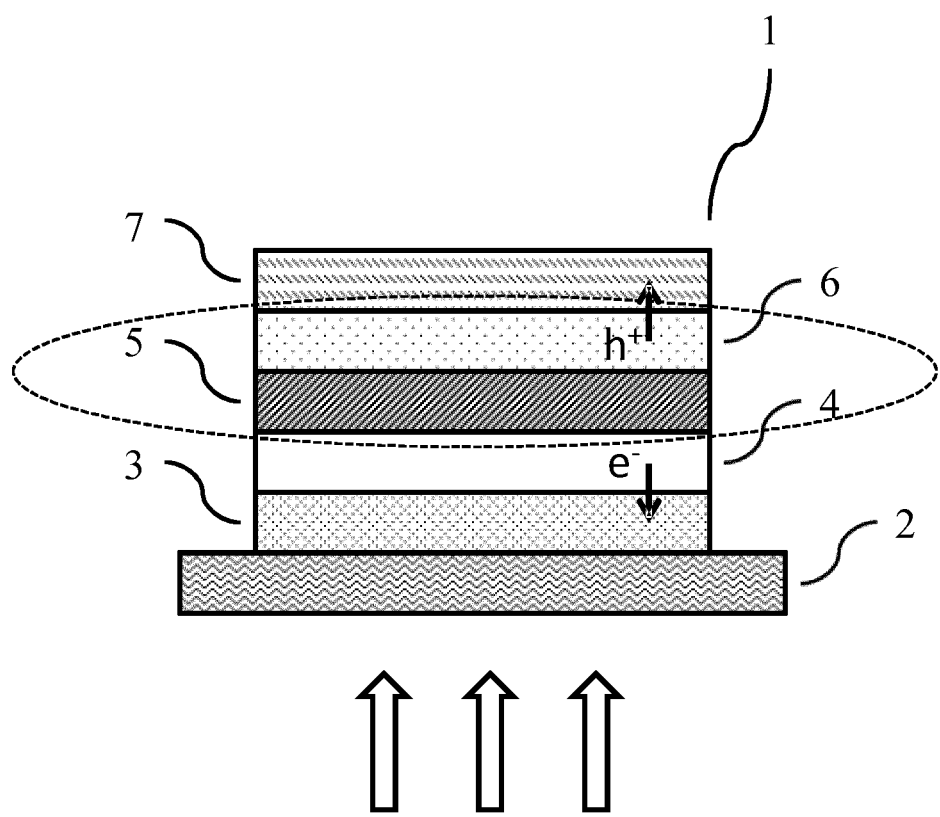

present invention also relates to a layered body obtainable by this process, to dispersions, to an electronic device, to a process for the preparation of a photovoltaic device and to the photovoltaic device that is obtainable by this process.

5 Claims, 3 Drawing Sheets

(51) Int. Cl.
*H01L 51/00* (2006.01)
*H01L 51/42* (2006.01)
*H01G 9/00* (2006.01)
(52) U.S. Cl.
CPC ...... *H01L 51/0032* (2013.01); *H01L 51/0037* (2013.01); *H01L 51/0077* (2013.01); *H01L 51/4226* (2013.01); *C08G 2261/1424* (2013.01); *C08G 2261/3223* (2013.01); *C08G 2261/794* (2013.01); *C08G 2261/91* (2013.01); *H01G 9/2031* (2013.01); *H01L 51/424* (2013.01); *Y02E 10/549* (2013.01); *Y02P 70/521* (2015.11)

(58) Field of Classification Search
CPC .. H01G 9/2059; H01G 9/0029; Y02E 10/549; C08G 2261/1424
See application file for complete search history.

(56) References Cited

FOREIGN PATENT DOCUMENTS

WO  WO-2014132076 A1  9/2014
WO  WO-2014154360 A2  10/2014

* cited by examiner

PEDOT IN PEROVSKITE SOLAR CELLS

This application is a national stage of International Patent Application No. PCT/EP2015/076870, filed Nov. 17, 2015, which claims the benefit of European Patent Application 14194360.5, filed Nov. 21, 2014, each of which is hereby incorporated by reference in its entirety.

The present invention relates to a process for the production of a layered body, to a layered body obtainable by this process, to dispersions, to an electronic device, to a process for the preparation of a photovoltaic device and to the photovoltaic device that is obtainable by this process.

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs. When light hits a solar cell, a fraction of the incident light is reflected by the surface and the remainder transmitted into the solar cell. The transmitted photons are absorbed by absorber material of the solar cell and the absorbed photon energy excites electrons of the absorber material, generating electron-hole pairs. These electron-hole pairs are then separated and collected by conductive electrodes on the solar cell surfaces.

Solar cells are very commonly based on silicon as the absorber material, often in the form of a Si wafer. Here, a p-n junction is commonly prepared either by providing an n-type doped Si substrate and applying a p-type doped layer to one face or by providing a p-type doped Si substrate and applying an n-type doped layer to one face to give in both cases a so called p-n junction. Both n-type and p-type solar cells are possible and have been exploited industrially.

Recently solar cells using metalorganic absorber materials showing a perovskite structure have been published with high efficiencies of above 15% power conversion efficiency (Kim et al.; J. Phys. Chem., 2014, 118, 5615-5625). A typical structure of a perovskite type solar cell is fluorine doped tin oxide (FTO)/titanium sub-oxide ($TiO_x$)/perovskite/hole transport layer (for example spiro-OMeTAD)/silver) (=structure 1). The perovskite is the light absorbing active layer and the name is termed by its $RMX_3$ crystal structure, in which R is, for example, $CH_3NH_3$, M is Pb and X can be selected from the group consisting of Cl, I and Br. The HTM spiro-OMeTAD is a triphenylamine-based molecule (2,2',7,7'-tetrakis(N,N'-di-p-methoxy-phenylamine)-9,9'-spirobifluorene), and while several alternatives have been proposed, spiro-OMeTAD still remains the most widely used and best performing solid-state hole-transporting material (Docampo et al., Adv. Mater. 2014, 26, 4013-4030). Other alternatives are photoactive p-type polymers for organic photovoltaics such as P3HT and PCPDTBT, poly- and oligo-triarylamine (PTAA) and carbazole based small molecules, which are mainly used in the stated architecture (Lim et al., Adv. Mater. 2014, 26, 6461-6466 and Xu et al., Adv. Mater., 2014, 26, 6629-6634).

However, the current hole transport materials in these perovskite structures such as spiro-OMeTAD show low conductivity and are low molecular weight materials. When applied in solar cells in thicker layers, which is often necessary in order to prevent diffusion of metal ions (like silver ions) from the anode layer into the light absorbing active layer or for smoothening the outer surface of the active layer, they suffer of resistive losses and parasitic light absorption especially in semitransparent device structures.

An object of the present invention is thus to reduce or even overcome at least one of the disadvantages of the state of the art in connection with the preparation of photovoltaic devices, in particular in connection with solar cells having an inverted structure, in which the photoactive layer is made of a material having a perovskite type crystal structure, such as a $CH_3NH_3PbI_3$.

In particular, it was an object of the present invention to provide a process for the production of a layered body or for the production of a photovoltaic device, in particular a solar cell having an inverted structure, wherein a photoactive layer made of a material having a perovskite type crystal structure, such as a $CH_3NH_3PbI_3$, can easily be coated with a hole transport layer, wherein the hole transport layer does not show the disadvantageous of the spiro-OMeTAD-layers known from the inverted perovskite type solar cells of the prior art.

A contribution to the solution of at least one of the above objects is provided by the subject matter of the category-forming independent claims, wherein the therefrom dependent subclaims represent preferred embodiments of the present invention, whose subject matter likewise make a contribution to solving at least one object.

EMBODIMENTS

I. A process for the production of a layered body, at least comprising the process steps:
   I) provision of a photoactive layer comprising a material having a perovskite type crystal structure;
   II) superimposing the photoactive layer at least partially with a coating composition A) comprising an electrically conductive polymer a) and an organic solvent b);
   III) at least partial removal of the organic solvent b) from the coating composition A) superimposed in process step II), thereby obtaining an electrically conductive layer superimposed on the photoactive layer.

II. The process according to embodiment I, wherein the material having a perovskite type crystal structure has the formula $R'MX_3$, wherein
   R' is an organic, monovalent cation selected from primary, secondary, tertiary or quaternary organic ammonium compounds, including N-containing heterorings and ring systems, R' having from 1 to 15 carbons and 1 to 20 heteroatoms, or $Cs^+$
   M is a divalent metal cation selected from the group consisting of $Cu^{2+}$, $Ni^{2+}$, $Co^{2+}$, $Fe^{2+}$, $Mn^{2+}$, $Cr_{2+}$, $Pd^{2+}$, $Cd^{2+}$, $Ge^{2+}$, $Sn^{2+}$, $Pb^{2+}$, $Eu^{2+}$ and $Yb^{2+}$, and
   X is independently selected from the group consisting of $F^-$, $Cl^-$, $Br^-$, $I^-$, $NCS^-$, $CN^-$ and $NCO^-$.

III. The process according to embodiment II, wherein
   R' is $CH_3NH^{3+}$,
   M is $Pb^{2+}$, and
   X is independently selected from the group consisting of $F^-$, $Cl^-$, $I^-$ and $Br^-$.

IV. The process according to anyone of embodiments I to III, wherein the conducting polymer a) comprises cationic polythiophene.

V. The process according to embodiment IV, wherein the conducting polymer a) is a salt or a complex of a cationic polythiophene and a counter-ion.

VI. The process according to embodiment V, wherein the counter-ion is a copolymer comprising polymerized styrene monomer units at least a part of which is sulfonated and polymerized non-sulfonated monomer units and wherein molar ratio of the non-sulfonated monomer units is at least 5%, based on the total amount of monomer units in the copolymer.

VII. The process according to embodiment V, wherein the counter-ion is a hydrogenated styrene-isoprene block copolymers with the structure A-B-C-B-A, in which the block A corresponds to a polystyrene block which is at least partially substituted with tert-butyl groups, the block B corresponds to a block of alternating copolymerised ethylen-propylene units and the block C corresponds to a sulphonated polystyrene block.

VIII. The process according to any one of embodiments I to VII, wherein the water content of the composition A) with which the photoactive layer is at least partially superimposed in process step II) is less than 2 wt.-%, preferably less than 0.5 wt.-%, in each case based on the total weight of composition A).

IX. The process according to any one of embodiments I to VIII, wherein the organic solvent b) is a non-polar, aprotic solvent.

X. The process according to any one of embodiments I to IX, wherein the dielectric constant of the organic solvent b) is between $1 \times 10^{-30}$ and $20 \times 10^{-30}$ Cm.

XI. The process according to any one of embodiments I to X, wherein the organic solvent b) has a dipole moment of less than 7 D.

XII. The process according to any one of embodiments I to XI, wherein the organic solvent b) is a solvent that, when being superimposed on the surface of the photoactive layer, exhibits a ΔA-value of less than 5%, wherein the ΔA-value is calculated by formula (I)

$$\Delta A = (A_0 - A_D)/A_0 \times 100\% \quad (I)$$

in which $A_0$ is the absorption of the photoactive layer before and $A_D$ the absorption of the photoactive layer after of the photoactive layer has been superimposed with the organic solvent b) for 30 s, in each case determined at 490 nm.

XIII. The process according to anyone of embodiments I to XII, wherein the photoactive layer is at least partially covered with one or two additional layers before it is superimposed with coating composition A) in process step II).

XIV. A layered body obtainable by the process according to anyone of embodiments I to 13.

XV. A dispersion comprising:
 a) a salt or a complex of a cationic polythiophene with a counter-ion;
 b) an organic solvent with a ΔA-value of less than 5%, wherein the ΔA-value is calculated by formula (I)

$$\Delta A = (A_0 - A_D)/A_0 \times 100\% \quad (I)$$

in which $A_0$ is the absorption before and $A_D$ the absorption after a $CH_3NH_3PbI_3$-layer has been superimposed with the organic solvent b) for 30 s, in each case determined at 490 nm.

XVI. A dispersion comprising:
 a) a salt or a complex of a cationic polythiophene with a counter-ion;
 b) an organic solvent with a dielectric constant between $1 \times 10^{-30}$ and $20 \times 10^{-30}$ Cm;
 c) an additive selected from the group of a metal nanowire, a carbon nanotube, a graphene and a cross-linking agent.

XVII. A dispersion comprising:
 a) a salt or a complex of a cationic polythiophene with a counter-ion;
 b) an organic solvent
 wherein the dispersion has an iron content of less than 100 ppm, based in the total weight of the dispersion.

XVIII. The dispersion according to anyone of embodiments XV to XVII, wherein the polymeric counter ion is a copolymer comprising polymerized styrene monomer units at least a part of which is sulfonated and polymerized non-sulfonated monomer units and wherein molar ratio of the non-sulfonated monomer units is at least 5%, based on the total amount of monomer units in the copolymer.

XIX. The dispersion according to anyone of embodiments XV to XVII, wherein the counter-ion is a hydrogenated styrene-isoprene block copolymers with the structure A-B-C-B-A, in which the block A corresponds to a polystyrene block which is at least partially substituted with tert-butyl groups, the block B corresponds to a block of alternating copolymerised ethylen-propylene units and the block C corresponds to a sulphonated polystyrene block.

XX. The dispersion according to anyone of embodiments XV to XIX, wherein the conductivity of an electrically conductive layer made by coating a glass substrate with the dispersion and drying the thus obtained layer structure for 3 minutes at 200° C. on a hot plate is at least 0.2 S/cm, preferably at least 1 S/cm.

XXI. The dispersion according to anyone of embodiments XV to XX, wherein the water content of the dispersion is less than 2 wt.-%, preferably less than 0.5 wt.-%, in each case based on the total weight of the dispersion.

XXII. An electronic device comprising a layered body according to embodiment XIV or comprising an electrically conductive layer that has been prepared with a coating composition A) as defined in anyone of embodiments I and IV to XII or with a dispersion according to anyone of embodiments XV to XVI.

XXIII. The electronic device according to embodiments XII, wherein the electronic device is a photovoltaic device (1).

XXIV. A process for the preparation of a photovoltaic device (1), comprising the process steps:
 i) provision of a multilayer-precursor body comprising
  a first electrode (3);
  a photoactive layer (5), wherein the photoactive layer (5) is made of a material having a perovskite type crystal structure; and
  an electron transport layer (4) that is localized between the first electrode (3) and the photoactive layer (5);
 ii) superimposing the photoactive layer (5) of the multi-layer-precursor body at least partially with a coating composition A) comprising an electrically conductive polymer a) and an organic solvent b);
 iii) at least partial removal of the organic solvent b) from the coating composition A) superimposed in process step ii), thereby obtaining an electrically conductive hole transport layer (6) superimposed on the photoactive layer (5);
 iv) superimposing the hole transport layer (6) at least partially with a second electrode (7).

XXV. A photovoltaic device (1) obtainable by the process according to embodiment XXIV.

The invention relates to a process for the production of a layered body, at least comprising the process steps:

I) provision of a photoactive layer comprising a material having a perovskite type crystal structure, preferably of a photoactive layer made of a material having a perovskite type crystal structure;
II) superimposing the photoactive layer at least partially with a coating composition A) comprising an electrically conductive polymer a) and an organic solvent b);
III) at least partial removal of the organic solvent b) from the coating composition A) superimposed in process step II), thereby obtaining an electrically conductive layer superimposed on the photoactive layer.

Surprisingly it has been found that conductive polymers, in particular salts or complexes of cationic polythiophenes and counter-ions that are dispersed in non-polar organic solvents can be used as hole transport layer in perovskite based solar cells. It has been found that intrinsically conductive polymers dispersed in organic solvents can be prepared and form films with high conductivity which are superior to the spiro-OMeTAD-layers known from the inverted perovskite type solar cells of the prior art. Solvents which turned out to be suitable have dielectric constant between $1 \times 10^{-30}$ Cm and $20 \times 10^{-30}$ Cm.

The advantages of organic conductive polymers (e.g. PEDOT:PSS or PEDOT:counter-ion) as a hole transport layers in perovskite-based solar cells are
a) no costly hole conductor materials like spiro-OMeTAD are needed,
b) a high transparency can be ensured because no colored Co(III) or lithium salt for doping and conductivity increase are needed,
c) the hole transport layer can be applied in an easy and scalable low cost roll-to-roll (R2R) process due to easy printing of a polymer dispersion,
d) water-free, air and temperature stable (>200° C.) conductive polymer films can be formed, and
e) a higher conductivity compared to available alternative materials can be reached, allowing the formation of thicker hole transport layers for the purpose of inhibiting the diffusion of metal ions from the anode layer into the active layer or for the purpose of smoothening the outer surface of the active layer.

In process step I) of the process according to the present invention a photoactive layer comprising a material having a perovskite type crystal structure is provided, preferably a photoactive layer made of a material having a perovskite type crystal structure.

The expression "perovskite" as used herein, does not specifically refer to the Perovskite material, $CaTiO_3$. For the purpose of the present invention the expression "material having a perovskite type crystal structure" encompasses and preferably relates to any material that has the same type of crystal structure as calcium titanium oxide and of materials in which the bivalent cation is replaced by two separate monovalent cations. The perovskite structure has the general stoichiometry $R'MX_3$, where R' and M are cations and X is an anion. The R' and M cations can have a variety of charges and in the original Perovskite mineral ($CaTiO_3$), the R' cation is divalent and the M cation is tetravalent. According to a preferred embodiment of the process according to the present invention the perovskite type material is an organic-inorganic perovskite hybrid material which exhibits the combined properties of organic composites and inorganic crystalline. The inorganic component forms a framework bound by covalent and ionic interactions which provide high carrier mobility. The organic component helps in the self-assembly process of those materials, it also enables the hybrid materials to be deposited by low-cost technique as other organic materials. An additional important property of the organic component is to tailor the electronic properties of the organic-inorganic material by reducing its dimensionality and the electronic coupling between the inorganic sheets.

According to a preferred embodiment of the process according to the present invention in the perovskite type crystal structure having the formula $R'MX_3$
R' is an organic, monovalent cation selected from primary, secondary, tertiary or quaternary organic ammonium compounds, including N-containing heterorings and ring systems, R having from 1 to 15 carbons and 1-20 heteroatoms or $Cs^+$;
M is a divalent metal cation selected from the group consisting of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$ and $Yb^{2+}$, and
X is independently selected from the group consisting of $F^-$, $Cl^-$, $Br^-$, $I^-$, $NCS^-$, $CN^-$ and $NCO^-$.

Suitable examples of a perovskite type material in which R' is $Cs^+$ are $CsSnI_3$, $CsSnCl_3$, $CsSnBr_3$ and derivatives (so called "lead-free perovskites").

In this context it is particularly preferred that R is an amine group selected from the group consisting of formulas (1) to (8):

(1)

(2)

(3)

(4)

(5)

(6)

(7)

(8)

wherein any one of $R^1$, $R^2$, $R^3$ and $R^4$ is independently selected from C1 to C15 aliphatic or heteroaliphatic substituents and C4 to C15 aromatic or heteroaromatic substituents, wherein any one, several or all hydrogens in said substituent may be replaced by halogen and wherein, if there are two or more carbons, up to half of said carbons in said substituents may be replaced by a N, S or O heteroatom, and wherein, in any one of the compounds (2) to (8) the two or more of the substituents present may be covalently connected to each other to form a substituted or unsubstituted ring or ring system.

According to a particularly preferred embodiment of the process according to the present invention in the perovskite type crystal structure having the formula R'MX$_3$
R' is CH$_3$NH$_3^+$,
M is Pb$^{2+}$, and
X is independently selected from the group consisting of F$^-$, Cl$^-$, I$^-$ and Br$^-$, most preferably I$^-$.

Examples of suitable perovskite materials can be selected from the group consisting of CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$NH$_3$SnBrI$_2$, CH$_3$NH$_3$SnBrCl$_2$, CH$_3$NH$_3$SnF$_2$Br, CH$_3$NH$_3$SnIBr$_2$, CH$_3$NH$_3$SnICl$_2$, CH$_3$NH$_3$SnF$_2$I, CH$_3$NH$_3$SnClBr$_2$, CH$_3$NH$_3$SnI$_2$Cl, CH$_3$NH$_3$SnF$_2$Cl and mixtures thereof.

A photoactive layer based on such organic-inorganic perovskite hybrid materials can, for example, be prepared by first depositing a thin film of MX$_2$, such as PbI$_2$, by vacuum-deposition on a suitable substrate, such as a glass or a quartz substrate. The thus obtained coated substrate is subsequently dipped into a solution containing the desired organic ammonium cation, such as a solution of CH$_3$NH$_3$I, for a short period of time (see, for example, U.S. Pat. No. 5,871,579). Using this technique, thin films of different layered organic-inorganic perovskites such as (R"NH$_3$)$_2$(CH$_3$NH$_3$)$_{n-1}$M$_n$I$_{3n+1}$ (R"=butyl, phenethyl; M=Pb, Sn; and n=1, 2) and three-dimensional perovskites such as CH$_3$NH$_3$MI$_3$ (M=Pb, Sn; i.e. n=∞) can be prepared at room temperature. According to another approach MX$_2$, such as PbI$_2$, and the organic component, such as CH$_3$NH$_3$I, are both dissolved in an appropriate solvent, such as N,N-dimethylformamide or γ-butyrolactone, and a substrate is then coated with the thus obtained solution. A film comprising the organic-inorganic perovskite hybrid material is obtained if the solvent is subsequently removed in a drying step (see, for example, Jeng et al., Adv. Mater. 2013, 25, 3727-3732).

According to a particularly preferred embodiment of the photoactive layer that is provided in process step I) the photoactive layer comprises a porous dielectric scaffold material onto which the above described material having a perovskite type crystal structure is coated. Such porous materials are disclosed in WO 2013/171520 A1. As used herein, the term "porous" refers to a material within which pores are arranged. In a "porous dielectric scaffold material" the pores are volumes within the dielectric scaffold where there is no dielectric scaffold material. The term "dielectric material", as used herein, refers to material which is an electrical insulator or a very poor conductor of electric current. The term dielectric therefore excludes semi conducting materials such as titania. The term dielectric, as used herein, typically refers to materials having a band gap of equal to or greater than 4.0 eV.

Preferably, the dielectric scaffold material comprises an oxide of aluminium, zirconium, silicon, zinc, yttrium, ytterbium or titanium, for example zinc oxide, titania, zirconium oxide, silica, alumina, ytterbium oxide or yttrium oxide; or alumina silicate. Often, dielectric scaffold material comprises silica or alumina. Most preferably the dielectric scaffold material comprises porous alumina. The porosity of said dielectric scaffold material is usually equal to or greater than 50%, more preferably greater than 70%.

The porous dielectric scaffold material can be produced by a process comprising washing a dispersion of a dielectric material and mixing the washed dispersion with a solution comprising a pore-forming agent which is a combustible or dissolvable organic compound. The pore-forming agent is removed later in the process by burning the agent off or by selectively dissolving it using an appropriate solvent. Such a process is disclosed in detail in WO 2013/171520 A1.

The photoactive layer comprising the material having the perovskite type crystal structure is then coated onto the dielectric scaffold material by means of the process described above (i. e. by first depositing a thin film of MX$_2$ by vacuum-deposition and by subsequently dipping the coated dielectric scaffold material into a solution containing the desired organic ammonium cation for a short period of time or by coating the dielectric scaffold material with a composition in which MX$_2$ and the organic component are both dissolved in an appropriate solvent. The process of coating a dielectric scaffold material with a photoactive layer comprising a material having a perovskite type crystal structure is also disclosed in detail in WO 2013/171520 A1.

The thickness of the photoactive layer that is provided in process step I) is preferably in the range from 1 to 5000 nm, more preferably in the range from 50 to 2000 nm and most preferably in the range from 100 to 600 nm. If the photoactive layer that is provided in process step I) comprises a porous dielectric scaffold material onto which the material having the perovskite type crystal structure is coated, as described above, thickness of the photoactive layer is preferably in the range from 500 to 5000 nm and more preferably in the range from 1000 to 3000 nm.

In process step II) of the process according to the present invention the photoactive layer that has been obtained in process step I) is at least partially superimposed with a coating composition A) comprising an electrically conductive polymer a) and an organic solvent b).

As a conductive polymer a) conjugated polymers such as polypyrroles, polythiophenes, polyanilines, polyacetylenes or polyphenylenes can be used, wherein the use of polythiophenes is particularly preferred. According to a preferred embodiment of the process according to the present invention the conductive polymer a) therefore comprises a polythiophene. Preferred polythiophenes are those having repeating units of the general formula (I) or (II) or a combination of units of the general formulas (I) and (II), preferably a polythiophene with repeating units of the general formula (II):

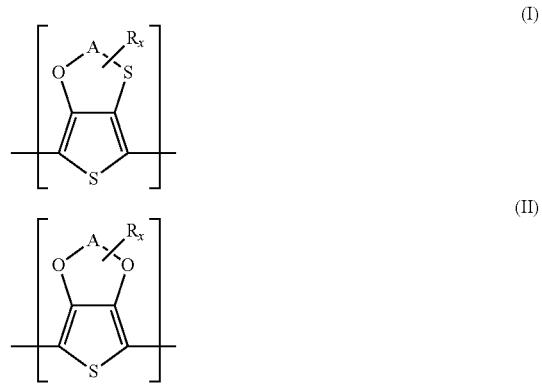

wherein
A represents an optionally substituted C$_1$-C$_5$-alkylene radical,
R represents a linear or branched, optionally substituted C$_1$-C$_{18}$-aliphatic or heteroaliphatic radical, an optionally substituted C$_5$-C$_{12}$-cycloaliphatic or cycloheteroaliphatic alkyl radical, an optionally substituted C$_6$-C$_{14}$-aryl or heteroaryl radical, an optionally substituted C$_7$-C$_{18}$- aralkyl or heteroaralkyl radical, an optionally substituted $C_1$-$C_4$-hydroxyaliphatic or hydroxyheteroalphatic radical or a hydroxyl radical, x represents an integer from 0 to 8 and in the case where several radicals R are bonded to A, these can be identical or different.

The general formulae (I) and (II) are to be understood as meaning that x substituents R can be bonded to the alkylene radical A.

Polythiophenes having recurring units of the general formula (II) wherein A represents an optionally substituted $C_2$-$C_3$-alkylene radical and x represents 0 or 1 are particularly preferred.

In the context of the invention, the prefix "poly" is to be understood as meaning that the polymer or polythiophene comprises more than one identical or different recurring units of the general formulae (I) and (II). In addition to the recurring units of the general formulae (I) and/or (II), the polythiophenes can optionally also comprise other recurring units, but it is preferable for at least 50%, particularly preferably at least 75% and most preferably at least 95% of all the recurring units of the polythiophene to have the general formula (I) and/or (II), preferably the general formula (II). The percentage figures stated above are intended here to express the numerical content of the units of the structural formula (I) and (II) in the total number of monomer units in the foreign-doped conductive polymer. The polythiophenes comprise a total of n recurring units of the general formula (I) and/or (II), preferably of the general formula (II), wherein n is an integer from 2 to 2,000, preferably 2 to 100. The recurring units of the general formula (I) and/or (II), preferably of the general formula (II), can in each case be identical or different within a polythiophene. Polythiophenes having in each case identical recurring units of the general formula (II) are preferred.

According to a very particular embodiment of the process according to the invention, at least 50%, particularly preferably at least 75%, still more preferably at least 95% and most preferably 100% of all the recurring units of the polythiophene are 3,4-ethylenedioxythiophene units. According to the most preferred embodiment of the process according to the present invention the conductive polymer a) therefore comprises poly(3,4-ethylenedioxythiophene).

The polythiophenes preferably in each case carry H on the end groups.

In the context of the invention, $C_1$-$C_5$-alkylene radicals A are preferably methylene, ethylene, n-propylene, n-butylene or n-pentylene. $C_1$-$C_{18}$-Alkyl radicals R preferably represent linear or branched $C_1$-$C_{18}$-alkyl radicals, such as methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or noctadecyl, $C_5$-$C_{12}$-cycloalkyl radicals R represent, for example, cyclopentyl, cyclohexyl, cycloheptyl, cyclooctyl, cyclononyl or cyclodecyl, $C_5$-$C_{14}$-aryl radicals R represent, for example, phenyl or naphthyl, and $C_7$-$C_{18}$-aralkyl radicals R represent, for example, benzyl, o-, m-, p-Tolyl, 2,3-, 2,4-, 2,5-, 2,6-, 3,4-, 3,5-xylyl or mesityl. The preceding list serves to illustrate the invention by way of example and is not to be considered conclusive.

In the context of the invention, numerous organic groups are possible as optionally further substituents of the radicals A and/or of the radicals R, for example alkyl, cycloalkyl, aryl, aralkyl, alkoxy, halogen, ether, thioether, disulphide, sulphoxide, sulphone, sulphonate, amino, aldehyde, keto, carboxylic acid ester, carboxylic acid, carbonate, carboxylate, cyano, alkylsilane and alkoxysilane groups and carboxamide groups.

The polythiophenes are preferably cationic, "cationic" relating only to the charges on the polythiophene main chain. The positive charges are not shown in the formulae, since their precise number and position cannot be determined absolutely. However, the number of positive charges is at least 1 and at most n, where n is the total number of all recurring units (identical or different) within the polythiophene.

To compensate the positive charge, the cationic polythiophenes require anions as counter-ions. It is preferable in this connection for the conductive polymer a) in the coating composition A) employed in process step II) to comprise a cationic polythiophene, which is present in the form of a salt or a complex of the cationic polythiophene and a counter-ion, preferably in the form of a salt or a complex of a poly(3,4-alkylenedioxythiophene) and a counter-ion, wherein monomeric and polymeric anions can be used as the counter-ions.

Polymeric anions are preferable to monomeric anions as counter-ions, since they contribute towards film formation and because of their size lead to electrically conductive films which are thermally stable. Polyanions here can be, for example, anions of polymeric carboxylic acids, such as polyacrylic acids, polymethacrylic acid or polymaleic acids, or of polymeric sulphonic acids, such as polystyrenesulphonic acids and polyvinylsulphonic acids.

In this context it is particularly preferred that the counter-ion is a copolymer comprising polymerized styrene monomer units at least a part of which is sulfonated and polymerized non-sulfonated monomer units and wherein molar ratio of the non-sulfonated monomer units is at least 5%, preferably at least 20% and most preferably at least 40%, in each case based on the total amount of monomer units in the copolymer. Suitable copolymers comprising polymerized styrene monomer units at least a part of which is sulfonated and polymerized non-sulfonated units are, for example, disclosed in DE 10 2008 023008 A1. The polymeric anion that is obtained in Example 7 of DE 10 2008 023008 A1 can be considered as a particularly suitable counter-ion in the present invention.

Also suitable as counter-ions are the sulphonated synthetic rubbers that are disclosed in WO 2012/059215 A1. In this context particularly preferred are hydrogenated or unhydrogenated, preferably hydrogenated styrene-isoprene block copolymers with the structure A-B-C-B-A, in which the block A corresponds to a polystyrene block which is at least partially substituted with tert-butyl groups, the block B corresponds to a hydrogenated or unhydrogenated, preferably however to a hydrogenated polyisoprene block (a fully hydrogenated polyisoprene block corresponds chemically to a block of alternating copolymerised ethylen-propylene units) and the block C corresponds to an at least partially sulphonated polystyrene block. The lengths of the blocks A, B and C is preferably at least 5 monomer units, particularly preferably at least 10 units and most preferably at least 20 units. Such copolymers are for example obtainable from the company Kraton Polymers, Houston, USA, under the product name NEXAR®.

The molecular weight of the counter-ions is preferably 1,000 to 2,000,000, particularly preferably 2,000 to 500,000. The molecular weight is determined by gel permeation chromatography using polymers of defined molecular weights, in particular using polystyrene in the case of solutions in water-immiscible solvents or using polystyrene sulphonic acid in the case of water-miscible solvents.

The weight ratio of the conjugated polymer, preferably of the polythiophene, to the counter-ion (polythiophene:counter-ion) in the coating composition A) is preferably in a range from 1:0.1 to 1:100, preferably in a range from 1:0.2 to 1:20 and particularly preferably in a range from 1:0.5 to 1:10.

The amount of conductive polymer a) (in the case of a salt or a complex of a conjugated polymer and a counter-ion the total amount of the conjugated polymer and the counter-ion) in the coating composition A) is preferably in the range from 0.1 to 25 wt.-%, more preferably in the range from 0.5 to 15 wt.-% and most preferably in the range from 1 to 10 wt.-%, in each case based on the total weight of the coating composition A).

The coating composition that is applied in process step A) further comprises an organic solvent b), wherein it is preferred that the organic solvent b) is a non-polar, aprotic organic solvent. In this context it is particularly preferred that the dielectric constant of the organic solvent b) is between $1 \times 10^{-30}$ and $20 \times 10^{-30}$ Cm, more preferably between $1 \times 10^{-30}$ and $17 \times 10^{-30}$ Cm and most preferably between $1 \times 10^{-30}$ and $7 \times 10^{-30}$ Cm. It is furthermore preferred that the organic solvent b) is characterized by a dipole moment of less than 7 D, more preferably of less than 5 D and most preferably less than 2 D.

Suitable organic solvents b) are
aromatic hydrocarbons such as benzene, toluene, xylene, mesitylene or biphenyl,
halogenated aromatic hydrocarbons such as fluorobenzene, chlorobenzene, bromobenzene, iodobenzene, 2-chlorotoluene, 3-chlorotoluene, 4-chlorotoluene, 1,3-dichlorobenzene, 1,4-dichlorobenzene, 1,2-dichlorobenzene, 1,3,5-trichlorobenzene, 1,2,4-trichlorobenzene or 1,2,3-trichlorobenzene,
ethers such as diethylether, diisopropylether, methyltertbutylether dibutylether, diphenylether, anisole and ethylenglycol ethers such as polyethylenglycol (PEG), diethylene glycol monomethyl ether, diethylene glycol monoethyl ether, ethylene glycol dimethyl ether, ethylene glycol diethyl ether, propylen glycol monopropyl ether, dipropylen glycol monomethylether, dipropylen glycol dimethylether, diethylene glycol monomethyl ether or ethylene glycol dibutyl ether,
siloxanes such as hexamethyldisiloxane, octamethyldisiloxane, decamethyldisiloxane, oligomethyldisiloxane, polymethyldisiloxane or polysiloxane, or
esters such as methylacetate, ethylacetate, propylacetate or butylacetate, methylbenzoate, ethylbenzoate, propylbenzoate, butylbenzoate, γ-butyrolactone, γ-valerolactone, γ-valerolactone, ethylene glycol methyl ether acetate, ethylene glycol monoethyl ether acetate, ethylene glycol monobutyl ether acetate, propylene glycol methyl ether acetate.

Particularly preferred organic solvents b) are solvents which, when being superimposed on the surface of the photoactive layer, exhibit a ΔA-value of less than 5%, more preferably of less than 2.5% and most preferably of less than 1%, wherein the ΔA-value is calculated by formula (I)

$$\Delta A = (A_0 - A_D)/A_0 \times 100\% \quad (I)$$

in which $A_0$ is the absorption of the photoactive layer before and $A_D$ the absorption of the photoactive layer after the photoactive layer has been superimposed with the organic solvent b) for 30 s, in each case determined at 490 nm. The ΔA-value is determined by the test method disclosed herein (see the test method "Superficial dissolving properties") using the photoactive layer onto which composition A) is applied in process step II).

The coating composition A) that is employed in process step II) may comprises further additives c) in addition to the conductive polymer a) and the organic solvent b), wherein these additives c) can be selected from the group consisting of binders, crosslinking agents, viscosity modifiers, pH regulators, additives which increase the conductivity, antioxidants, additives which modify work function, auxiliary solvents which are required, for example, for homogeneous mixing of the individual components or a mixture of two or more of these additives c).

Suitable binders are, for example, polyalkylene glycols, polyacrylates, polyurethanes, polyesters, polyethers, polyamides or polyvinyl alcohol.

Suitable crosslinking agents are melamine compounds, masked isocyanates, functional silanes—e.g. tetraethoxysilane, alkoxysilane hydrolysates, e.g. based on tetraethoxysilane, epoxysilanes, such as 3-glycidoxypropyltrialkoxysilane, epoxides or oxetanes, amines, quaternary amines, polyamines or quaternary polyamines.

Suitable viscosity modifiers are hydroxypropyl methylcellulose (HPMC), methyl cellulose, ethyl cellulose, xanthan gum, polyvinyl alcohol, carboxy methyl cellulose, and hydroxy ethyl cellulose.

Suitable pH regulators are acids and bases which do not influence film production. Possible bases are amines and primary, tertiary or alkylamines.

Suitable additives which increase the conductivity are, for example, polyalkylene glycols, in particular polyethylene glycols or polypropylene glycols, polyglycerols or mixtures of these, polyols, such as propylene glycol and ethylene glycol, sulphoxides, such as dimethylsulphoxide, carboxylic acid amides, such as methylacetamide, dimethylacetamide, dimethylformamide, N-methylpyrrolidone, N-cyclohexylpyrrolidone, ionic liquids, sugars, such as sorbitol. Also suitable and particularly preferred as additives which increase the conductivity are metal nanowires, in particular silver nanowires, carbon nanotubes and graphenes. Suitable silver nanowires that can be used as additives which increase the conductivity of composition A) are, for example, disclosed in WO-A-2012/022332, WO-A-2014/127909, DE-A-10 2010 017706, U.S. Pat. No. 7,585,349 or in WO-A-2008/073143). In this context it is also preferred that the silver nanowires and the electrically conductive polymer b) are present in composition A) in a relative amount such that the weight ratio of silver:electrically conductive polymer b) (in the case of a complex of a cationic polythiophene and a counter-ion the weight ratio of silver:cationic polythiophene+counter-ion) in the composition A) is in a range of from 10:1 to 1:10, particularly preferably in a range of from 5:1 to 1:5 and most preferably in a range of from 2:1 to 1:2.

Suitable antioxidants are citric acid, gallate esters, tocopherols and other phenolic antioxidants.

The above mentioned additives c) can be present in the coating composition A) in an amount from 0.1 to 50 wt.-%, preferably in an amount of 0.5 to 25 wt.-% and most preferably in an amount of 1 to 10 wt.-%, in each case based on the total amount of the coating composition A).

The coating composition A) that is used in process step II), in particular the coating composition A) that comprises a salt or a complex of a polythiophene and a counter-ion, can be prepared in different preparation methods. According to a first approach the salt or the complex are prepared by oxidatively polymerizing the monomers on which the polythiophene is based, particularly preferred 3,4-ethylenedioxythiophene, in the presence of the counter-ion in the organic solvent b). According to a second approach the monomers are oxidatively polymerized in the presence of the counter-ion in a protic solvent, particularly preferred in water, and the protic solvent is then substituted by the organic solvent b). Such a solvent-substitution process is, for example, disclosed in U.S. Pat. No. 6,692,662 B2.

Oxidising agents that are suitable for the oxidative polymerisation of the monomers on which the conjugated polymers are based can be used as oxidising agents. For practical reasons, inexpensive and easy-to-handle oxidising agents are preferred, for example iron(III) salts such as $FeCl_3$, $Fe(ClO_4)_3$ and the iron(III) salts of organic acids and of inorganic acids comprising organic radicals. The iron(III) salts of sulphuric acid hemiesters of $C_1$-$C_{20}$ alkanols, for example the Fe(III) salt of lauryl sulphate, are cited by way of example as iron(III) salts of inorganic acids comprising organic radicals. The following are cited by way of example as iron(III) salts of organic acids: the Fe(III) salts of $C_1$-$C_{20}$ alkyl sulphonic acids, such as methane- and dodecane-sulphonic acid; aliphatic $C_1$-$C_{20}$ carboxylic acids such as 2-ethylhexyl carboxylic acid; aliphatic perfluorocarboxylic acids, such as trifluoroacetic acid and perfluorooctanoic acid; aliphatic dicarboxylic acids such as oxalic acid and above all of aromatic sulphonic acids optionally substituted with $C_1$-$C_{20}$ alkyl groups, such as benzenesulphonic acid, p-toluenesulphonic acid and dodecylbenzenesulphonic acid. The iron(III) salts of organic acid have the big applicational advantage that they are partially or completely soluble in organic solvents and in particular in water-immiscible organic solvents. Organic peroxides such as for example tert-butyl peroxide, diisobutyryl peroxide, di-n-propyl peroxydicarbonate, didecanoyl peroxide, dibenzoyl peroxide, tert-butyl peroxybenzoate, di-tert-amyl peroxide can also be used as oxidising agents With respect to the coating compostions A) that is used in process step II) it is particularly preferred that the water content of the coating composition A) is less than 2 wt.-%, preferably less than 0.5 wt.-% and most preferably less than 0.3 wt.-%, in each case based on the total weight of composition A). The water content is determined by the test method disclosed herein (the test method "Water content measurement by Karl-Fischer titration").

Furthermore, it is also preferred that the metal content, in particular the iron content, of the coating composition A) is less than 100 ppm, more preferably less than 50 ppm and most preferably less than 10 ppm, in each case based on the total weight of composition A). The iron content is determined by the test method disclosed herein (the test method "Iron content").

The conductivity of an electrically conductive layer made by coating a glass substrate with coating composition A) and drying the thus obtained layer structure for 3 minutes at 200° C. on a hot plate is preferably at least 0.2 S/cm, more preferably at least 1 S/cm and most preferably at least 5 S/cm.

Superimposing the photoactive layer with coating composition A) in process step II) can be accomplished by known methods, for example by spin coating, dipping, pouring, dropping on, injecting, spraying, knife application, spreading or printing, for example inkjet, screen, intaglio, offset or pad printing, in a wet film thickness of 0.1 μm to 250 μm, preferably in a wet film thickness of 0.5 μm to 50 μm.

According to a particular embodiment of the process according to the present invention coating composition A) is directly applied to the photoactive layer such that the electrically conductive layer is in direct contact with the photoactive layer. According to a further particular embodiment of the process according to the present invention coating composition A) is not directly applied to the photoactive layer. In this particular embodiment the photoactive layer can be at least partially covered with one or two additional layers before it is superimposed with coating composition A) in process step II).

Suitable additional layers that can be mentioned in this context comprise inorganic hole transport layers such as layers comprising nickel oxide, molybdenum oxide or wolfram oxide, organic hole transporting layers such as layers comprising spiro-OMeTAD (2,2',7,7'-tetrakis-(N,N-dipmethoxyphenylamine)-9,9'-spirobifluorene)), P3HT (poly (3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide), tBP (tert-butylpyridine) or PTTA (Poly [bis(4-phenyl)(2,4,6-trimethylphenyl)amine]), exciton blocking layer oder thin isolating layers. Additional layers can also be based on a material selected from the group consisting of CuI (copper iodide), polyanilline, CuSCN (copper(I) thiocyanate), 4,4',4"-Tris[phenyl(m-tolyl) amino] triphenylamine (m-MTDATA), poly- and oligo-triarylamine (PTAA) and carbazole based small molecules.

In process step III) of the process according to the present invention the organic solvent b) is at least partially removed from the coating composition A) superimposed in process step II), thereby obtaining an electrically conductive layer superimposed on the photoactive layer. Partial removal of the organic solvent b) can be achieved by simply drying the superimposed photoactive layer, preferably by heating the photoactive layer to a temperature in the range from 10 to 200° C., wherein the drying conditions are of course dependent from the boiling point of the organic solvent b).

A contribution towards solving the above mentioned objects is also made by a layered body obtainable by the process according to the present invention, preferably by a layered body obtained by the process according to the present invention. This layered body comprises the photoactive layer that is coated with a layer of the conductive polymer.

A contribution towards solving the above mentioned objects is also made by a dispersion comprising:
a) a salt or a complex of a cationic polythiophene and a counter-ion;
b) an organic solvent with a ΔA-value of less than 5%, more preferably of less than 2.5% and most preferably of less than 1%, wherein ΔA is calculated by formula (I)

$$\Delta A = (A_0 - A_D)/A_0 \times 100\%  \qquad (I)$$

in which $A_0$ is the absorption before and $A_D$ the absorption after a $CH_3NH_3PbI_3$-layer has been superimposed with the solvent b) for 30 s, in each case determined at 490 nm. The ΔA-value is determined by the test method disclosed herein (see the test method "Superficial dissolving properties") using a $CH_3NH_3PbI_3$-layer as the photoactive layer.

A contribution towards solving the above mentioned objects is also made by a dispersion comprising:
a) a salt or a complex of a cationic polythiophene with a counter-ion;
b) an organic solvent with a dielectric constant between $1\times10^{-30}$ and $20\times10^{-30}$ Cm, more preferably between $1\times10^{-30}$ and $17\times10^{-30}$ Cm and most preferably between $1\times10^{-30}$ and $7\times10^{-30}$ Cm;
c) an additive selected from the group of a metal nanowire, a carbon nanotube, a graphene and a crosslinking agent.

Suitable silver nanowires that can be used as additives which increase the conductivity of the dispersion are, for example, disclosed in WO-A-2012/022332, WO-A-2014/127909, DE-A10 2010 017706, U.S. Pat. No. 7,585,349 or in WO-A-2008/073143). In this context it is also preferred that the silver nanowires and the electrically conductive polymer b) are present in the dispersion in a relative amount such that the weight ratio of silver:total amount of cationic polythiophene and counter-ion in the dispersion is in a range of from 10:1 to 1:10, particularly preferably in a range of from 5:1 to 1:5 and most preferably in a range of from 2:1 to 1:2.

A contribution towards solving the above mentioned objects is also made by a dispersion comprising:
a) a salt or a complex of a cationic polythiophene with a counter-ion;
b) an organic solvent;
wherein the dispersion has an iron content of less than 100 ppm, more preferably less than 50 ppm and most preferably less than 10 ppm, in each case based on the total weight of the dispersion. The iron content is determined by the test method disclosed herein (the test method "Iron content").

Preferred cationic polythiophenes and preferred counter-ions are those cationic polythiophenes and counter-ions that have already been mentioned as preferred embodiments in connection with the process according to the present invention. Accordingly, a particularly preferred counter ion is a copolymer comprising polymerized styrene monomer units at least a part of which is sulfonated and polymerized non-sulfonated monomer units and wherein molar ratio of the non-sulfonated monomer units is at least 5%, more preferably at least 20% and most preferably at least 40%, in each case based on the total amount of monomer units in the copolymer. Also particularly preferred as counter-ions are hydrogenated or unhydrogenated, preferably hydrogenated styrene-isoprene block copolymers with the structure A-B-C-B-A, in which the block A corresponds to a polystyrene block which is at least partially substituted with tert-butyl groups, the block B corresponds to a hydrogenated or unhydrogenated, preferably however to a hydrogenated polyisoprene block (a fully hydrogenated polyisoprene block corresponds chemically to a block of alternating copolymerised ethylen-propylene units) and the block C corresponds to an at least partially sulphonated polystyrene block.

According to a further preferred embodiment of the above mentioned dispersions according to the present invention the conductivity of an electrically conductive layer made by coating a glass substrate with the dispersion and drying the thus obtained layer structure for 3 minutes at 200° C. on a hot plate is at least 0.2 S/cm, more preferably at least 1 S/cm and most preferably at least 5 S/cm.

It is furthermore preferred that the dispersions according to the present invention have a water content of less than 2 wt.-%, preferably less than 0.5 wt.-% and most preferably less than 0.3 wt.-%, in each case based on the total weight of the dispersion. The water content is determined by the test method disclosed herein (the test method "Water content measurement by Karl-Fischer titration").

A contribution towards solving the above mentioned objects is also made by an electronic device comprising a layered body according to the present invention or comprising an electrically conductive layer that has been prepared with the coating composition A) that has been described in connection with the process for the preparation of a layered body according to the present invention or that has been prepared with one of the dispersions according to the present invention, wherein the electronic device is preferably a photovoltaic device, particularly preferred a solar cell having an inverted structure.

In a solar cell having a so called "conventional structure" the photoactive layer is generally sandwiched between a transparent indium tin oxide (ITO) and aluminum (Al) electrodes, wherein the Al electrode collects the electrons. In a solar cell having an "inverted structure", the photoactive layer can be sandwiched between an ITO electrode coated with a chemically stable n-type metal oxide and an electrode made of a non-corrosive metal such as gold or silver. In this arrangement the photo-generated electrons in the photoactive layer are collected by the modified ITO, while the photo-generated holes are collected by the high-work function metal. These polymer solar cells are described as inverted because the electrons flow in the opposite direction to those in conventional solar cells.

A contribution towards solving the above mentioned objects is also made by a process for the preparation of a photovoltaic device, preferably for the preparation of a solar cell having an inverted structure, comprising the process steps:
i) provision of a multilayer-precursor body comprising
   a first electrode 3;
   a photoactive layer 5, wherein the photoactive layer 5 is made of a material having a perovskite type crystal structure; and
   an electron transport layer 4 that is localized between the first electrode 3 and the photoactive layer 5;
ii) superimposing the photoactive layer 5 of the multilayer-precursor body at least partially with a coating composition A) comprising an electrically conductive polymer a) and an organic solvent b);
iii) at least partial removal of the organic solvent b) from the composition A) superimposed in process step ii), thereby obtaining a hole transport layer 6 superimposed on the photoactive layer 5;
iv) superimposing the hole transport layer 6 at least partially with a second electrode 7.

In process step i) a multilayer-precursor body comprising a first electrode 3, a photoactive layer 5 and an electron transport layer 4 that is localized between the first electrode 3 and the photoactive layer 5 is provided, wherein the photoactive layer 5 is made of a material having a perovskite type crystal structure.

Preferred examples for the material of the first electrode 3 and the second electrode 7 include transparent and highly conductive materials, such as, for example, indium tin oxide (ITO), indium zinc oxide (IZO), tin oxide (SnO2), zinc oxide (ZnO), fluorotin oxide (FTO) and antimony tin oxide (ATO). Further examples of the material of the first and the second electrode 3,7 include ultra-thin and thin metal layers of magnesium (Mg), aluminium (Al), platinum (Pt), silver (Ag), gold (Au), copper (Cu), molybdenum (Mo), titanium (Ti), tantalum (Ta), a combination of at least two of these (e.g. an alloy of these, aluminium-lithium, calcium (Ca), magnesium-indium (Mg—In) or magnesium-silver (Mg—

Ag), which can be present in a co-deposition layer) and carbon-containing materials, such as, for example, graphite and carbon nanotubes. In this context, the metal layers described above, if they are to be light-transmitting, can be either ultra-thin or also in the form of a strip grid or used for covering as nanotubes, nanowires or networks thereof. Conductive layers comprising conductive materials, for example conductive PEDOT:PSS layers, are furthermore also possible above all as transparent materials for the first and the second electrode 3,7. The thickness of the first and the second electrode 3,7 is conventionally in a range of from 2 to 500 nm, particularly preferably in a range of from 50 to 200 nm. Ultra-thin transparent or semitransparent metal layers are particularly preferred and have a thickness in a range of from 2 to 20 nm.

The first electrode 3 can be applied onto an appropriate substrate 2. Preferably substrate 2 is substantially transparent (colourless and transparent, coloured and transparent, or clear and transparent), in particular in the wavelength range of the absorption spectra of the active materials (electron donor and acceptor materials), and renders possible the passage of external light, such as, for example, sunlight. Examples of the substrate 2 include glass substrates and polymer substrates. Non-limiting examples of polymers for the substrate include polyether sulphone (PES), polyacrylate (PAR), polyether-imide (PEI), polyethylene naphthalate (PEN), polyethylene terephthalate (PET), polyphenylene sulphide (PPS), polyallylate, polyimide, polycarbonate (PC), cellulose triacetate (TAC) and cellulose acetate propionate (CAP). When choosing suitable substrates 2 it is preferable for these to be suitable for a reel-to-reel production process for the layered body. The substrate 2 can furthermore be equipped with additional functional coatings. Antireflection finishes, antireflective agents, UV blockers and gas and moisture barriers are preferred here. The substrate 2 can have a single-layer structure which comprises a mixture of at least one material. In another embodiment, it can have a multilayer structure, which comprises layers arranged one above the other, each of which comprises at east two types of materials.

The electron transport layer 4 is preferably formed of at least one material selected from the group consisting of titanium, n-type semiconducting metal oxides such as $TiO_x$, $TiO_2$, ZnO, $SnO_2$, $MoO_3$, $WO_3$, $Fe_2O_3$, $Zn_2SnO_3$, $BaTiO_3$ and $BaSnO_3$, or organic semiconductors such as those based on phenyl-C61-butyric acid methyl ester (PCBM), wherein an electron transport layer 4 comprising $TiO_x$ is particularly preferred in case of a first electrode 3 that is based on ITO and wherein an electron transport layer 4 comprising titanium is particularly preferred in case of a first electrode 3 that is based on Al. The thickness of the electron transport layer 4 is conventionally in a range of from 2 nm to 500 nm, particularly preferably in a range of from 10 to 200 nm The photoactive layer 5 of the precursor body that is provided in process step i) is made of a material having a perovskite type crystal structure. Preferred photoactive layers are those layers which have already been mentioned above in connection with the process for the preparation of a layered body according to the present invention. A particularly preferred photoactive layer 5 comprises a porous dielectric scaffold material onto which the material having a perovskite type crystal structure is coated. Such porous materials have already been described in connection of the process for the production of a layered body according to the present invention.

In process step ii) the photoactive layer 5 of the multilayer-precursor body is at least partially superimposed with a coating composition A) comprising an electrically conductive polymer a) and an organic solvent b) and in process step iii) the organic solvent b) is at least partially removed from the composition A) superimposed in process step ii), thereby obtaining an electrically conductive hole transport layer 6 superimposed on the photoactive layer 5. Process steps ii) and iii) of the process for the preparation of a photovoltaic device basically correspond to process steps II) and III) of the process for the preparation of a layered body according to the present invention. Preferred coating compositions A) are those that have already been mentioned in connection with process step II) and preferred conditions of superimposing the photoactive layer 5 with coating composition A) in process step ii) and the way of removing the organic solvent b) in process step iii) correspond to the preferred conditions that have already been mentioned in connection with process steps II) and III).

In process step iv) the hole transport layer 6 is at least partially superimposed with a second electrode 7, wherein the second electrode 7 can be made of any of the materials that have been mentioned before as suitable materials for the first and the second electrode 3,7.

A contribution towards solving the above mentioned objects is also made by a photovoltaic device that is obtainable by the process according to the present invention for the preparation of a photovoltaic device, by a photovoltaic device that is obtained by this process, wherein the photovoltaic device is preferably a solar cell having an inverted structure.

The invention is now explained in more detail with the aid of test methods and non-limiting figures and examples.

FIG. 1 shows a schematic representation of the sequence of layers according to the invention obtainable by a process for the preparation of a photovoltaic device 1, the photovoltaic device 1 being a solar cell with an inverted structure. It comprises a glass substrate 2 on which a transparent first electrode 3 serving as the cathode layer is applied from, for example, ITO. The first electrode 3 is followed by an electron transport layer 4 for the improvement of electron extraction, such as a $TiO_x$ layer. Onto the electron transport layer 4 is applied a photoactive layer 5 made of a material having a perovskite type crystal structure, for example $CH_3NH_3PbI_3$. Onto the photoactive layer 5 there is applied a conductive polymer layer serving as a hole transport layer 6 that is preferably based on a salt or complex of a polythiophene and a counter-ion. Onto the conductive polymer layer 6 there is applied a non-transparent second electrode 7 serving as the anode layer, such as a silver layer. In this particular embodiment of a solar cell with an inverted structure light reaches the photoactive layer from beneath through the glass substrate and the transparent first electrode 3 (indicated by the arrows in FIG. 1). The dotted circle FIG. 1 indicates a layered structure according to the present invention.

Figure 2:
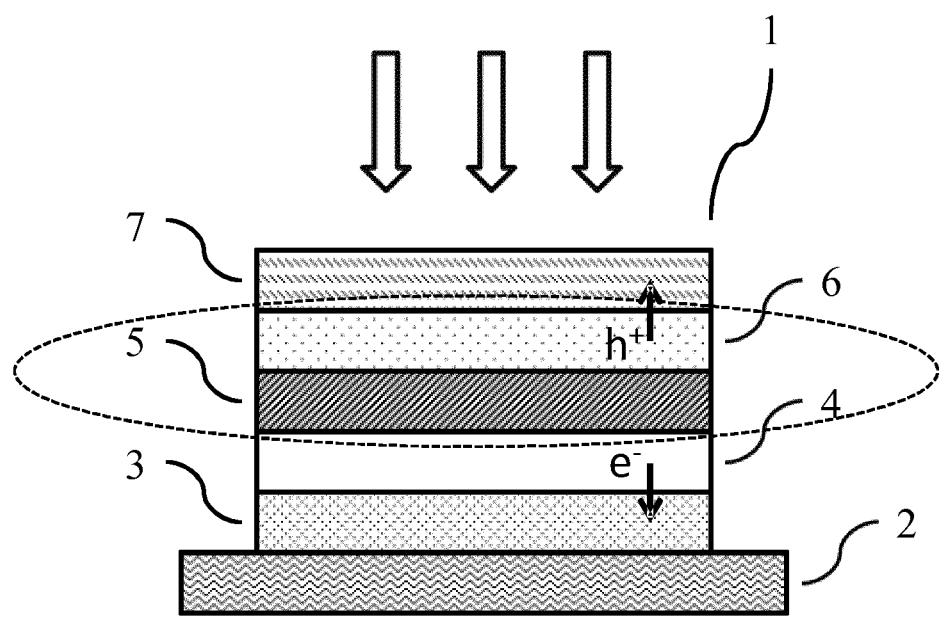

FIG. 2 shows a schematic representation of the sequence of layers of the photovoltaic device shown in FIG. 1, with the difference that the first electrode 3 is made of a non-transparent material, such as an aluminium layer, and the second electrode 7 is a transparent layer, for example a metal layer that is applied in the form of parallel strips or in the form of a grid or that is based on a conductive polymer, such as PEDOT. In this particular embodiment of a solar cell with an inverted structure light reaches the photoactive layer from above through the second electrode 7 and the transparent layer of the conductive polymer 6 (indicated by the arrows in FIG. 2). The dotted circle FIG. 2 again indicates a layered structure according to the present invention.

Figure 3:
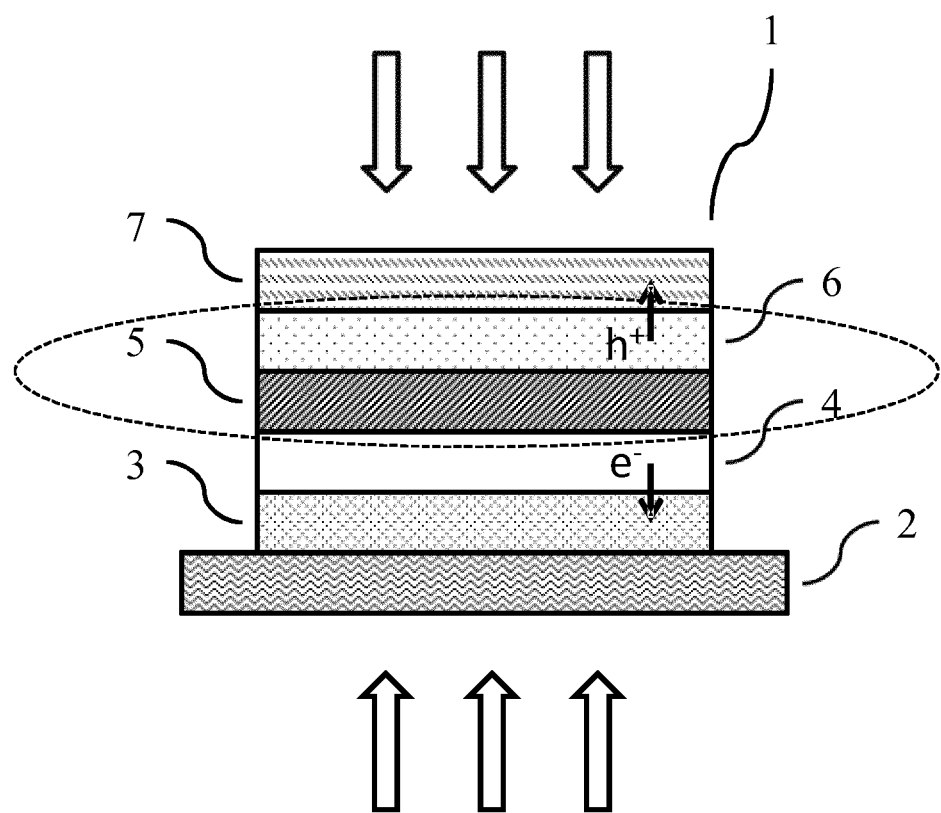

FIG. 3 shows a schematic representation of the sequence of layers of the photovoltaic device shown in FIG. 1, with the difference that the second electrode 7 is also a transparent layer. In this particular embodiment of a solar cell with an inverted structure light reaches the photoactive layer from beneath through the glass substrate and the transparent first electrode 3 and from above through the second electrode 7 and the transparent layer of the conductive polymer 6 (indicated by the arrows in FIG. 3). The dotted circle FIG. 3 again indicates a layered structure according to the present invention.

TEST METHODS

To evaluate the functional behaviour of a layer of the composition employed in the process according to the invention to the photoactive layer, the procedure is as follows:

Substrate Cleaning

ITO-precoated glass substrates (5 cm×5 cm) are cleaned by the following process before use:
1. thorough rinsing with acetone, isopropanol and water,
2. ultrasound treatment in a bath at 70° C. in a 0.3% strength Mucasol solution (Merz) for 15 min,
3. thorough rinsing with water,
4. drying by spinning off in a centrifuge,
5. UV/ozone treatment (PR-100, UVP Inc., Cambridge, GB) for 15 min directly before use.

$TiO_x$ planar layer (according to literature: Docampo et al. Nature Comm. 2013)

The titanium sub-oxide ($TiO_x$) planar layer is solution-processed. The process comprises the application of four solutions:
a) Hydrochloric acid (HCl) stock solution 1:
   0.5 g concentrated HCl (37 wt. %, technical grade, AppliChem) are added to 1.55 g of isopropanol (anhydrous, 99.5%, Sigma-Aldrich) and stirred for 15 min in air leading to a 2M HCl stock solution.
b) HCl stock solution 2:
   600 µL of HCl stock solution 1 are diluted in 34.5 g of isopropanol (anhydrous, 99.5%, Sigma-Aldrich) and stirred for ca. 12 h under nitrogen leading to a 0.026 M HCl stock solution.
c) $TiO_x$ precursor solution 1:
   554 µL titanium(IV) isopropoxide (99.99%, trace metal basis, Sigma-Aldrich) is added to 3.00 g of isopropanol using a micropipette followed by 15 minutes of stirring. All handling is done under nitrogen in a glovebox.
d) $TiO_x$ precursor solution 2:
   3.00 g of HCl stock solution 2 are added slowly by dropping to 3.00 g of $TiO_x$ precursor solution 1 under vigorous stirring. The solution was stirred for 15 min before filtering through a 0.45 µm PTFE syringe filter. The solution should be used fresh.

The solution is then applied to the cleaned ITO substrate by spin coating at 2000 rpm for 60 seconds and then dried in air on a hot-plate at 300° C. for 30 min. before drying the edges are cleaned of the $TiO_x$ to allow good contact for the device fabricated later on. This heat treatment of ITO did not compromise its initial conductivity Active layer (according Jeng et al. Adv. Mat. 2013)
Perovskite Precursor Solution:
   0.56 g lead(II) iodide ($PbI_2$, 99%, Sigma-Aldrich) and 0.19 g methyl ammonium iodide ($CH_3NH_3I$, Solaronix) are dissolved in 2.5 g of N,N-dimethyl formamid (DMF, anhydrous, 99.8%, Sigma-Aldrich) in 1:1 equimolar ratio (30 wt. %) in a screw cap pill bottle and stirred at 60° C. for 12 hours or until all the material has dissolved. All handling and processing is done under nitrogen in a glovebox.

Perovskite Photo-Active Layer Device Preparation:
The perovskite precursor solution is now dripped on to the ITO/$TiO_x$ substrate and superfluous solution is spun off by spin coating at 3000 rpm for 30 seconds using a spin acceleration of 200 rpm/s. During the coating process and especially during drying step at elevated temperature the deep purple light absorbing perovskite $CH_3NH_3PbI_3$ is formed. The layers are then dried directly on a hot-plate at 100° C. for 15 min followed by 2 min at 130° C. in air.

Deposition of the Conductive PEDOT:Counterion Layer
For the production of the PEDOT:counter-ion layer (hole transport layer) the dispersion is applied onto the above mentioned photoactive layer (layer sequence glass substrate/ITO/$TiO_x$/$CH_3NH_3PbI_3$ as a precursor (cf. sample preparation)). The coating composition was applied onto the $CH_3NH_3PbI_3$-layer of the precursor by means of a pipette to completely cover the area. Excess dispersion was spun off by spin coating (conditions: 20 s at approx. 1,000 rpm, in air). Thereafter, a drying process on a hot-plate was carried out in two steps: 5 min at 80° C. in air, followed by 10 min at 130° C. under nitrogen.

OPV Cells

For the further test of the coating composition, OPV cells having the following inverted layer structure of glass substrate/ITO/$TiO_x$/$CH_3NH_3PbI_3$/conductive PEDOT:counterion layer/silver were produced, $TiO_x$ having been applied with a layer thickness of approx. 70 nm, $CH_3NH_3PbI_3$ with a layer thickness of approx. 200-250 nm and PEDOT:counterion of about 100 nm, in the given sequence in accordance with the instructions already described above. The silver electrodes having a layer thickness of 300 nm were vapour-deposited using a reduced pressure vapour deposition unit (Edwards) at $<5\times10^{-6}$ mbar through shadow masks with a vapour deposition rate of about 10 Å/s. The shadow masks define the photoactive area of 0.28 $cm^2$. For accurate photocurrent measurement, the individual cells were carefully scratched out with a scalpel and therefore reduced to the precisely defined area, in order to avoid edge effects with additionally collected current due to conductive PEDOT:counterion or $CH_3NH_3PbI_3$. For measurements a pixel mask was applied to define the precise active area of measurement. Further all layers were removed at the substrate edges and painted with liquid silver paint to allow a good contact to ITO for device measurements. Now the devices were ready for current-voltage measurements and photovoltaic performance characterisation.

Superficial Dissolving Properties
The superficial dissolution of the photoactive layer (such as a CH3NH3PbI3-layer) is checked by the following process:
a) a stationary film of organic solvent b) is applied onto the photoactive layer for 30 s, wherein the photoactive layer has a thickness in the range from 100-300 nm (the film of liquid was applied over a large area on the active layer with a pipette);
b) the stationary film is washed off with toluene;
c) the washed film is rotated at 2000 rpm for 30 s;
d) the rotated film is dried on a hot plate for 1 min at 80° C.

If superficial dissolving takes place during the covering, this leads to a visible change in the colour or intensity of the contact area of the film. The superficial dissolving effect by the composition was measured by UV/Vis spectroscopy (PerkinElmer Lambda 900). In this context, the absorption of the non-treated active layer was measured and compared at exactly the same place before application of the liquid film and after washing off and drying. For the comparison, a wavelength of 490 nm was chosen. The change in the absorption at a wavelength then expresses the reduction in absorption and the associated detachment of material. If the liquid film does not lead to any superficial dissolving the surface remains unchanged, if dissolving is complete the film is removed from the contact area. The change in absorption at 490 nm ΔA was calculated according to the following formula:

$$\Delta A = (A_0 - A_D)/A_0 \times 100\%$$

wherein $A_0$ is the absorption before the dissolution and $A_D$ after the dissolution. When determining the $A_0$- and $A_D$- value the absorption of the substrate onto which the photo-active layer is applied has to be subtracted ($A_0 = A_{0, \text{ as determined}} - A_{Substrate}$; $A_D = A_{D, \text{ as determined}} - A_{substrate}$).

Cell Characterization

The perovskite PV cells produced were measured with a solar simulator (1,000 W quartz-halogen-tungsten lamp, Atlas Solar Celltest 575) with a spectrum of 1.5 AM. The light intensity can be attenuated with inserted grating filters. The intensity at the sample plane is measured with a Si photocell and is approx. 1,000 W/m². The Si photocell was calibrated beforehand with a pyranometer (CM10). The temperature of the sample holder is determined with a heat sensor (PT100+testtherm 9010) and is max. 40° C. during the measurement. The two contacts of the OPV cell are connected to a current/voltage source (Keithley 2800) via a cable. Before measuring, the cell was light soaked for 5 minutes to activate the $TiO_x$ to allow full functionality and reproducibility. For the measurement, the cell was scanned in the voltage range of from −1.0 V to 1.5 V and back to −1.0 V and the photocurrent was measured. The measurement steps were 0.01 V every 5 seconds to allow full charge equilibrium and to avoid hysteresis effect s. The measurement was performed three times per cell in total, first in the dark, then under illumination and finally in the dark again, in order to guarantee complete functioning of the cell after illumination. The data were recorded via a computer-based Labview program. This leads to the typical current density/voltage characteristic line of a diode, from which the OPV characteristic data, such as "open circuit voltage" ($V_{oc}$), "short circuit current density" ($J_{sc}$), fill factor (FF) and efficiency or effectiveness (Eff.) can be determined either directly or by calculation in accordance with the European standard EN 60904-3. The fill factor is then calculated according to Equation 1:

$$FF = \frac{V_{mpp} J_{mpp}}{V_{OC} J_{SC}} \quad \text{Equation 1}$$

wherein $V_{mpp}$ is the voltage and $J_{mpp}$ the current density at the "maximum power point" (mmp) on the characteristic line of the cell under illumination.

Electrical Conductivity:

The electrical conductivity means the inverse of the specific resistance. The specific resistance is calculated from the product of surface resistance and layer thickness of the conductive polymer layer. The surface resistance is determined for conductive polymers in accordance with DIN EN ISO 3915. In concrete terms, the polymer to be investigated is applied as a homogeneous film by means of a spin coater to a glass substrate 50 mm×50 mm in size thoroughly cleaned by the abovementioned substrate cleaning process. In this procedure, the coating composition is applied to the substrate by means of a pipette to completely cover the area and spun off directly by spin coating. The spin conditions for coating compositions were 20 s at approx. 1,000 rpm in air. Thereafter, a drying process on a hot-plate was carried out (3 min at 200° C. in air). For the test of the examples 6 and 7 (comparative examples) the drying process on a hot-plate was carried out 15 min at 130° C. in air. In all cases silver electrodes of 2.0 cm length at a distance of 2.0 cm are vapour-deposited on to the polymer layer via a shadow mask. The square region of the layer between the electrodes is then separated electrically from the remainder of the layer by scratching two lines with a scalpel. The surface resistance is measured between the Ag electrodes with the aid of an ohmmeter (Keithley 614). The thickness of the polymer layer is determined with the aid of a Stylus Profilometer (Dektac 150, Veeco) at the places scratched away.

Solids Content:

The solid content was determined by gravimetry using a precision scale (Mettler AE 240). First the empty weighing bottle including lid is weight in (Weight A). Then ca. 3 g of dispersion to be analysed is filled quickly into the bottle, closed by the lid and weighed again to determine the exact total weight B. The bottle is then placed in a fume hood without a lit for ca. 3 hours to allow the evaporation of volatile solvents at room temperature. In a second step the bottle is placed in a drying oven with ventilation (Memmert UNB200) at 100° C. for 16 17 hours. When the sample bottle is removed from the oven, immediate coverage by the glass lid is important due to the hygroscopic nature of the dry dispersion material. After 10-15 min of cooling down period the bottle is weighed again including lid to determine weight C. There is always a repeat determination of 2 samples.

wt. % solids content=
100×(C−A)/(B−A)     Calculation of the solid contents:

Water Content Measurement by Karl-Fischer Titration:

The water content is determined by Karl Fischer titration. A Metrohm 787 KF Titrino with a 703 titration stand is used to this end. The titration vessel is filled with analytical-grade methanol so that about 1 cm of the platinum electrode is submerged. Then approximately 5 ml of Hydranal buffer acid is pipetted in. The titration cell is automatically dried by starting the KFT program. Preparation is complete when the message "KFT conditioned" appears. Approximately 5 ml of the dispersion to be analysed is then introduced into the titration vessel using a syringe and the exact mass of the dispersion used is determined by back-weighing the syringe. The titration is then started. The measured value is determined as the mean of three individual measurements.

Iron Content:

The iron content was determined by inductively coupled plasma optical emission spectrometry (ICP-OES) using ICP-OES Spectroblue that was equipped with Autosamples Cetac ASX-520 and Smart-Analyser-Vision software.

Example 1

In a 1 L three-necked round-bottom flask equipped with mechanical stirrer 7.9 g of 3,4-ethylenedioxythiophene (Heraeus Precious Metals GmbH & Co KG, Germany) were added to a mixture of 130 g of tert-butyl methyl ether, 215 g of a solution of sulfonated block-copolymer in cyclohexane/heptane-mixture (Kraton Nexar MD 9150, 11.0% solids) and 9 g of para-toluene sulfonic acid (Aldrich) and stirred for 30 min. 15 g of dibenzoylperoxide (Aldrich) were added and the mixture was heated to reflux. After 6 h the mixture was allowed to cool to room temperature and diluted with 1175 g of tert-butyl methyl ether. After two days residual solids were filtered off and the filtrate was purified by diafiltration (ceramic membrane filter (Pall Schumasiv, pore size 50 nm, part number 88519721) in order to remove low molecular weight impurities <50 nm. After purification the solids content was determined to be 2.1%.

Analysis

| | |
|---|---|
| Solids content: | 2.1% (gravimetric) |
| Water content: | 0.2% (Karl-Fischer-Titration) |
| Solvent composition: | 88% methyl tert-butyl ether, 6% cyclohexane, 6% n-heptane; |
| Ratio PEDOT:counter-ion: | 1:3 (w/w) |
| Iron content: | less than 10 ppm |

Example 2

A 3 L three-necked round-bottom flask equipped with mechanical stirrer was charged with 1233 g toluene (Aldrich), 19.1 g of dipenzoylperoxide (158 mmol; Aldrich), 282 g of a solution of sulfonated block-copolymer in cyclohexane/heptane-mixture (Kraton Nexar MD 9150, 11.0% solids) and 46 g of para-toluene sulfonic acid (240 mmol, Aldrich). While stirring the mixture was purged with nitrogen gas for 30 min. After heating to 60° C. 10 g of 3,4-ethylenedioxythiophene (70 mmol; Clevios M V2; Heraeus Precious Metals GmbH & Co KG, Germany) dissolved in 137 g of toluene were added dropwise over 1 h. The dispersion was stirred for another 4 h at 60° C. After cooling to room temperature the dispersion was let to stand for one week before removing solids by filtration.

Analysis:

| | |
|---|---|
| Solids content: | 2.6% (gravimetric) |
| Residual Water: | 0.1% (Karl-Fischer-Titration) |
| Conductivity: | 0.2 S/cm |
| Solvent composition: | 86% toluene, 7% cyclohexane, 7% n-heptane |
| Ration PEDOT:counter-ion: | 1:3 |
| Iron content: | less than 10 ppm |

Example 3

The polymerization was prepared analog to Example 2 except that heptane was used as solvent.

Analysis:

| | |
|---|---|
| Solids content: | 2.6% (gravimetric) |
| Residual Water: | 0.2% (Karl-Fischer-Titration) |
| Conductivity: | 0.2 S/cm |
| Iron content: | less than 10 ppm |

Example 4

The polymerization was prepared analog to Example 2 except that a mixture of methyl-tert-butylether and ethylacetate (50:50 w/w) was used as solvent.

Analysis:

| | |
|---|---|
| Solids content: | 2.6% (gravimetric) |
| Residual Water: | 0.2% (Karl-Fischer-Titration) |

-continued

| | |
|---|---|
| Conductivity: | 2.0 S/cm |
| Iron content: | less than 10 ppm |

Comparative Example 1

A PEDOT:PSS dispersion was prepared in accordance with Example 2 of DE 10 2007 041722 A1.

Analysis:

| | |
|---|---|
| Solid content: | 1.3% (gravimetric) |
| Water content: | 98.7% |
| Conductivity: | 0.1 S/cm (without dimethylsulfoxide) |
| Ratio PEDOT:PSS | 1:2.5 |
| Iron content: | less than 10 ppm |

Comparative Example 2

The dispersion was prepared in accordance with composition 1a of WO 2014/154360 A2.

Analysis:

| | |
|---|---|
| Solid content: | 0.7% (gravimetric) |
| Water content: | 6% water |
| Conductivity: | 100 S/cm |
| Ratio PEDOT:PSS | 1:2.66 |
| Solvents: | water; ethylene glycol; propylene glycol; ethanol; isopropanol; dichlorobenzene |
| Iron content: | less than 10 ppm |

TABLE 1

List of all the coating compositions according to the invention and comparative examples with the solvent type or system, content of water and solids and conductivity.

| Coating composition | main solvent | solids content wt. % | water content wt. % | conductivity S cm$^{-1}$ |
|---|---|---|---|---|
| Example 2 (inventive) | toluene | 2.6 | 0.1 | 0.2 |
| Example 3 (inventive) | heptane | 2.6 | 0.2 | 0.2 |
| Example 4 (inventive) | MTBE:EA (1:1) | 2.8 | 0.2 | 2.0 |
| Comparative Example 1 | water | 1.3 | 98.7 | 0.1 |
| Comparative Example 2 | propylene glycol/EG | 0.7 | 6 | 100 |

Example 5

This example comprises experiments for further characterization and coating properties of solvent based PEDOT dispersions.

In the investigation of the superficial dissolving properties, for possible solvents as part of the coating composition according to the invention no superficial dissolving of the $CH_3NH_3PbI_3$ layer (490 nm) was found after 30 s of solvent exposure (see table 2). A reduction in the absorption of >5% was evaluated as a superficial dissolving process. In case of >50% a clear change in colour and intensity was to be found even with the naked eye which showed the complete removal of the layer, which thus clearly lies above a 50% reduction in absorption. Water, ethylene glycol, diethylene glycol and isopropanol (any polar alcohols) dissolve the active layer completely. Coating compositions based on non-polar organic solvents, on the other hand, showed no superficial dissolving properties.

TABLE 2

Superficial dissolving properties of selected solvents compared for $CH_3NH_3PbI_3$ after an action time of 30 s by a reduction in the absorption at the characteristic wavelengths of 490 nm as well as the dipole moment and the dielectric constant of the selected solvents.

| Batch/coating composition | ΔA [%] | Dipole moment of solvent [D] | Dielectric constant of solvent [$\times 10^{-30}$ Cm] |
|---|---|---|---|
| Water | >95 | 1.85 D | 80 |
| Isopropanol | >95 | 1.66 D | 18 |
| Isobutanol | 22 | 1.79 D | 16.68 |
| 1-Octanol | 8 | 1.68 D | 10.30 |
| Ethylene glycole | >95 | 2.28 D | 39 |
| Diethylene glycol | >95 | 2.69 D | 31.70 |
| Propylene glycole | 64 | 2.27 D | 32 |
| Tetrahydrofurane | >95 | 1.63 D | 7.5 |
| Toluene | 3 | 0.36 D | 2.38 |
| Heptane | 5 | 0.35 D | 1.92 |
| Butylbenzoate | 4 | 1.54 D | 5.52 |
| Ethylacetate | 10 | 1.78 D | 6.02 |
| Methyl-tert-butylether (MTBE) | 3 | 1.4 D | 2.6 |
| Hexamethyldisiloxane | <2 | 0.8 D | 2.2 |
| Polysiloxane | <2 | 0.6-0.9 D | <3 |
| Anisole | 2 | 1.38 D | 4.33 |
| Xylene | 2 | 0.07 D | 2.2 |
| Dichlorobenzene | 2 | 2.14 D | 9.8 |
| Tetraline | 2 | 0.61 D | 2.77 |

Table 3 shows that coating compositions according to the present invention all demonstrate a better film formation on top of the active layer $CH_3NH_3PbI_3$ than the coating compositions of the comparative examples. A very good wetting, was observed which indicates a good compatibility with the underlying active layer.

TABLE 3

Film formation by the conductive polymer coating composition.

| Coating composition | Composition solvent | film formation |
|---|---|---|
| Example 2 | Toluene | ++ |
| Example 3 | Heptane | ++ |
| Example 4 | MTBE:EA (1:1) | ++ |
| Comparative Example 1 | Water | -- |
| Comparative Example 2 | propylene glycol/EG | -- |

++=defect-free, homogeneous layer; +=homogeneous layer with <30 area % hole defects in the layer; 0=homogeneous layer with more than 30 to 60 area % hole defects in the layer; −=more than 60 area % hole defects in the layer; −−=no layer formation/beading Example 6

Example 6 shows the device performance of a Perovskite type solar cell using the dispersion prepared in Example 2 in comparison to the dispersions prepared I Comparative Examples 1 and 2.

For the test of the comparative examples based on either aqueous dispersion of Comparative Example 1 or the solvent based dispersion of Comparative Example 2 in the same layer sequence of glass substrate/ITO/$TiO_x$/$CH_3NH_3PbI_3$ as the precursor, the conductive polymer layer was in turn formed on the $CH_3NH_3PbI_3$-layer. The dispersions were applied to the $CH_3NH_3PbI_3$-layer of the precursor by means of a pipette to completely cover the area and were immediately spun off by spin coating (conditions: 30 s at approx. 1500 rpm, in air). Thereafter, the drying process on a hot-plate was carried out in two steps: 5 min at 80° C. in air, followed by 10 min at 130° C. under nitrogen.

TABLE 4

Photovoltaic device characteristic data of cells with coating composition as obtained in Example 2 from toluene according to the invention in cell a) and reference materials as comparative examples with coating composition based on the aqueous dispersion of Comparative Example 1 in cell b) or with coating composition based on the dispersion of Comparative Example 2 in cell c).

| OPV cell | PEDOT:counter-ion type coating composition | Active area [$cm^2$] | $V_{OC}$ [V] | $J_{SC}$ [$mA \cdot cm^{-2}$] | FF | Eff. [%] |
|---|---|---|---|---|---|---|
| Cell a) | Example 2 | 0.28 | 0.41 | 7.08 | 0.40 | 1.15 |
| Cell b) | Comparative Example 1 | 0.28 | 0 | 0 | 0 | 0.00 |
| Cell c) | Comparative Example 2 | 0.28 | 0 | 0 | 0 | 0.00 |

Working perovskite PV cells could be produced from Example 2 according to the invention. With a $J_{SC}$ of 7.10 mA $cm^{-2}$, a FF of 0.45 and an efficiency >0% the device works according to the definition of a photovoltaic cell. A Jsc>0 mA·$cm^{-2}$ shows a photo response and generated current from incoming light. Coating composition reference materials obtained in Comparative Examples 1 and 2 were not suitable for the production of a perovskite PV cell due to incompatibility of the solvent systems with the active material perovskite by means of complete dissolution.

The invention claimed is:

1. A dispersion comprising:
   a) a salt of a cationic polythiophene with a counter-ion or a complex of a cationic polythiophene with a counter-ion;
   b) an organic solvent with a ΔA-value of less than 5%, wherein the ΔA-value is calculated by formula (I)

$$\Delta A = (A_0 - A_D)/A_0 \times 100\% \quad (I)$$

wherein $A_0$ is an absorption before and $A_D$ is an absorption after a $CH_3NH_3PbI_3$-layer has been superimposed with the organic solvent b) for 30 seconds, in each case determined at 490 nm.

2. The dispersion according to claim 1, wherein the polymeric counter ion is a copolymer comprising polymerized styrene monomer units at least a part of which is sulfonated and polymerized non-sulfonated monomer units and wherein the molar ratio of the non-sulfonated monomer units is at least 5%, based on the total amount of monomer units in the copolymer.

3. The dispersion according to claim 1, wherein the counter-ion is a hydrogenated styrene-isoprene block copolymer with the structure A-B-C-B-A, in which block A is a polystyrene block which is at least partially substituted with tert-butyl groups, block B is a block of alternating copolymerized ethylene-propylene units and block C is a sulphonated polystyrene block.

4. The dispersion according to claim 1, wherein the conductivity of an electrically conductive layer made by coating a glass substrate with the dispersion and drying the thus obtained layer structure for 3 minutes at 200° C. on a hot plate is at least 0.2 S/cm.

5. The dispersion according to claim 1, wherein the water content of the dispersion is less than 2 wt.-% based on the total weight of the dispersion.

\* \* \* \* \*